(12) United States Patent
Liu et al.

(10) Patent No.: US 11,562,937 B2
(45) Date of Patent: Jan. 24, 2023

(54) SEMICONDUCTOR PACKAGE WITH PROTECTED SIDEWALL AND METHOD OF FORMING THE SAME

(71) Applicant: STMICROELECTRONICS PTE LTD, Singapore (SG)

(72) Inventors: Yun Liu, Singapore (SG); David Gani, Choa Chu Kang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 17/145,028

(22) Filed: Jan. 8, 2021

(65) Prior Publication Data
US 2021/0159136 A1 May 27, 2021

Related U.S. Application Data

(63) Continuation of application No. 16/270,927, filed on Feb. 8, 2019, now Pat. No. 10,910,287.
(Continued)

(51) Int. Cl.
*H01L 23/31* (2006.01)
*H01L 23/00* (2006.01)
(Continued)

(52) U.S. Cl.
CPC ........ *H01L 23/3114* (2013.01); *H01L 21/304* (2013.01); *H01L 21/561* (2013.01);
(Continued)

(58) Field of Classification Search
CPC ....... H01L 21/56; H01L 21/568; H01L 21/78; H01L 21/304; H01L 21/561; H01L 23/28;
(Continued)

(56) References Cited

U.S. PATENT DOCUMENTS 7,576,436 B2    8/2009 Hung
7,883,991 B1 *  2/2011 Wu ..................... H01L 25/0657
                                                          438/455
(Continued)

FOREIGN PATENT DOCUMENTS

CN    103295925 A    9/2013
CN    104377192 A    2/2015
(Continued)

*Primary Examiner* — Jose R Diaz
(74) *Attorney, Agent, or Firm* — Seed IP Law Group LLP

(57) ABSTRACT

A semiconductor package having a die with a sidewall protected by molding compound, and methods of forming the same are disclosed. The package includes a die with a first surface opposite a second surface and sidewalls extending between the first and second surfaces. A redistribution layer is formed on the first surface of each die. An area of the first surface of the die is greater than an area of the redistribution layer, such that a portion of the first surface of the die is exposed. When molding compound is formed over the die and the redistribution layer to form a semiconductor package, the molding compound is on the first surface of the die between an outer edge of the redistribution layer and an outer edge of the first surface. The molding compound is also on the sidewalls of the die, which provides protection against chipping or cracking during transport.

19 Claims, 8 Drawing Sheets

Related U.S. Application Data

(60) Provisional application No. 62/636,753, filed on Feb. 28, 2018.

(51) Int. Cl.

| | | |
|---|---|---|
| *H01L 21/78* | (2006.01) | |
| *H01L 21/56* | (2006.01) | |
| *H01L 21/304* | (2006.01) | |
| *H01L 23/28* | (2006.01) | |

(52) U.S. Cl.
CPC .............. *H01L 21/78* (2013.01); *H01L 23/28* (2013.01); *H01L 23/3185* (2013.01); *H01L 24/04* (2013.01); *H01L 24/14* (2013.01); *H01L 24/96* (2013.01); *H01L 24/11* (2013.01); *H01L 24/13* (2013.01); *H01L 2224/023* (2013.01); *H01L 2224/0401* (2013.01); *H01L 2224/056* (2013.01); *H01L 2224/05554* (2013.01); *H01L 2224/11334* (2013.01); *H01L 2224/13014* (2013.01); *H01L 2224/13101* (2013.01); *H01L 2224/14131* (2013.01); *H01L 2224/82* (2013.01); *H01L 2224/821* (2013.01); *H01L 2924/181* (2013.01); *H01L 2924/18162* (2013.01)

(58) Field of Classification Search
CPC ............. H01L 23/3114; H01L 23/3185; H01L 23/3128; H01L 24/02–04; H01L 24/11; H01L 24/13–14; H01L 24/96; H01L 2224/0401; H01L 2224/023; H01L 2224/82; H01L 2224/821; H01L 2224/02333; H01L 2224/14131; H01L 2924/181; H01L 2924/18162
See application file for complete search history.

(56) References Cited

U.S. PATENT DOCUMENTS

| | | | |
|---|---|---|---|
| 9,177,926 B2 | 11/2015 | Scanlan et al. | |
| 9,324,698 B2 | 4/2016 | Yu et al. | |
| 9,496,195 B2* | 11/2016 | Lin | ............ H01L 24/81 |
| 2003/0036219 A1 | 2/2003 | Masumoto et al. | |
| 2015/0243575 A1* | 8/2015 | Strothmann | ........ H01L 23/3157 |
| | | | 257/734 |
| 2017/0092529 A1* | 3/2017 | Han | .................... H01L 21/6835 |

FOREIGN PATENT DOCUMENTS

| | | |
|---|---|---|
| CN | 106233460 A | 12/2016 |
| CN | 107221517 A | 9/2017 |

\* cited by examiner

SEMICONDUCTOR PACKAGE WITH PROTECTED SIDEWALL AND METHOD OF FORMING THE SAME

BACKGROUND

Technical Field

The present disclosure is directed to packages having a semiconductor die sidewall protected by molding compound, and methods of forming the same.

Description of the Related Art

Wafer Level Chip Scale Packages ("WLCSPs") that include a silicon die or chip and molding compound are common in the packaging space because of their small size and efficient assembly process. One of the biggest challenges for WLCSPs is chipping or cracking of the silicon die during handling, transportation, or during various assembly processes, such as the surface mount technology assembly process. Past attempts to counterbalance these negative effects include forming molding compound in the WLCSPs using a front side mold approach or a fan out approach. However, both of these methods suffer from deficiencies in manufacturing efficiency and limited die protection in the resulting packages, which leads to an increase in chipping or cracking of the die, or other package failures.

In the front side mold approach, a half cut is performed between successive die on a wafer and molding compound is formed on the active side of the wafer and over each die. Because the molding compound is formed on the active side of the wafer, which includes solder bumps, the solder bumps must be cleaned of any mold residue in order to allow the packages to function when coupled to a substrate. After the cleaning, the wafer undergoes further processing, which includes separating the die into individual packages. These individual packages are then arranged on a carrier for transport.

The resulting WLCSPs produced by the front side mold process do not have sufficient protection on the sidewalls due to constraints of the half cut kerf width and silicon saw scribe lane width and thus do not provide adequate protection against die cracking or chipping during transport or handling. Accordingly, WLCSPs produced by the fan out approach remain at a high risk of package failure due to damage to the silicon chip. Further, the front side mold approach is inefficient because it requires an additional step of cleaning the mold residue on the solder bumps after forming the molding compound.

The fan out approach includes singulating a wafer into die, and arranging the usable die on a carrier. Then, molding compound is formed over each of the die on the carrier, with the molding compound formed from the backside of each die. This process is known in the art as "reconstruction," or in other words, constructing a "molded wafer." After forming the molding compound, the die undergo further processing, including forming multiple redistribution layers covering the active surface of each die and singulation of the die into packages. The packages are then placed on a carrier for transport.

While the fan out approach eliminates the need to clean the mold residue from the bumps, the fan out approach causes the molded wafer to be more susceptible to wafer cracking and breakage during performance of the process. As such, multiple warpage adjustment steps have to be performed during the process. In addition, the re-passivation material is limited to low cure polymer in order to be compatible with characteristics of the molded, reconstructed wafer.

BRIEF SUMMARY

The exemplary embodiments in the present disclosure are directed to improving reliability of semiconductor packages by reducing the possibility of chipping or cracking of a die during transport by providing molding compound on sidewalls and edges of a die. The exemplary embodiments also eliminate the need for warpage adjustment during the redistribution process and enable use of standard WLCSP redistribution materials and processes.

In one exemplary embodiment, a semiconductor package includes a die having a first surface opposite a second surface with the first surface having an area defined by a first outermost edge of the first surface. A redistribution layer, which may be a re-passivation layer or a metal, such as copper, is formed on the first surface of the die. An area of the redistribution layer is bounded by a second outermost edge, with the second area being less than the first area, so as to create a space between the first and second outermost edges. In other words, because the first outermost edge is spaced from the second outermost edge, a portion of the first surface of the die is exposed.

Then, molding compound is formed on the die and the distribution layer, with the molding compound being on the first surface of the die in the space between the first and second outermost edges described above. In some examples, the molding compound is also on the sidewalls of the die, as well as on the second surface of the die. In yet other embodiments, the semiconductor package includes one or more under bump metallization layers formed on the redistribution layer and solder balls coupled to respective ones of the under bump metallization layers.

In a second exemplary embodiment, a method of forming a semiconductor package having the above features is disclosed. The method begins with forming a redistribution layer on a first surface of a silicon wafer that includes a plurality of die. Then, the second surface of the silicon wafer, which is opposite the first surface, undergoes a backgrinding process to thin down the thickness of the silicon substrate. After backgrinding, the wafer is separated into a plurality of die by mechanical blade, laser processing, or etching. Each of the die include the first surface and the second surface and a sidewall extending between the first and second surfaces of the die. A portion of the redistribution layer is on the first surface of each die. Because an area of the redistribution layer on each die is less than an area of the first surface of each die, a portion of the first surface of die is exposed by the redistribution layer.

After separating the wafer into die, each of the die are inverted and coupled to a carrier. Then, molding compound is formed on the second surface of each die, the sidewalls of the die, and on the portion of the first surface of each die that is exposed by the redistribution layer. In other words, because the redistribution layer does not cover the first surface of the die, but rather, there is a space between an outer edge of the redistribution layer and an outer edge of the first surface of each die, molding compound is on the first surface of each die in the space.

In a third exemplary embodiment, the method includes coupling a plurality of solder balls to a corresponding one of a plurality of under bump metallization layers and forming a plurality of packages by separating the die from each other. In a fourth exemplary embodiment, a backgrind is performed on the molding compound before coupling the solder balls to the under bump metallization layers. In yet a fifth exemplary embodiment, the solder balls are coupled to the under bump metallization layers and then a backgrind is performed on the molding compound before singulating the die into packages.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with leadframes and chip packaging have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense that is as meaning "and/or" unless the content clearly dictates otherwise.

The present disclosure is generally directed to semiconductor packages having a die sidewall protected by molding compound and methods of forming the same. In an embodiment, the molding compound is on the sidewalls of each die and on a first surface of a die between an outer edge of a redistribution layer on the first surface and an outer edge of the die. A second surface of the die may be exposed or covered by the molding compound.

Figure 1A:
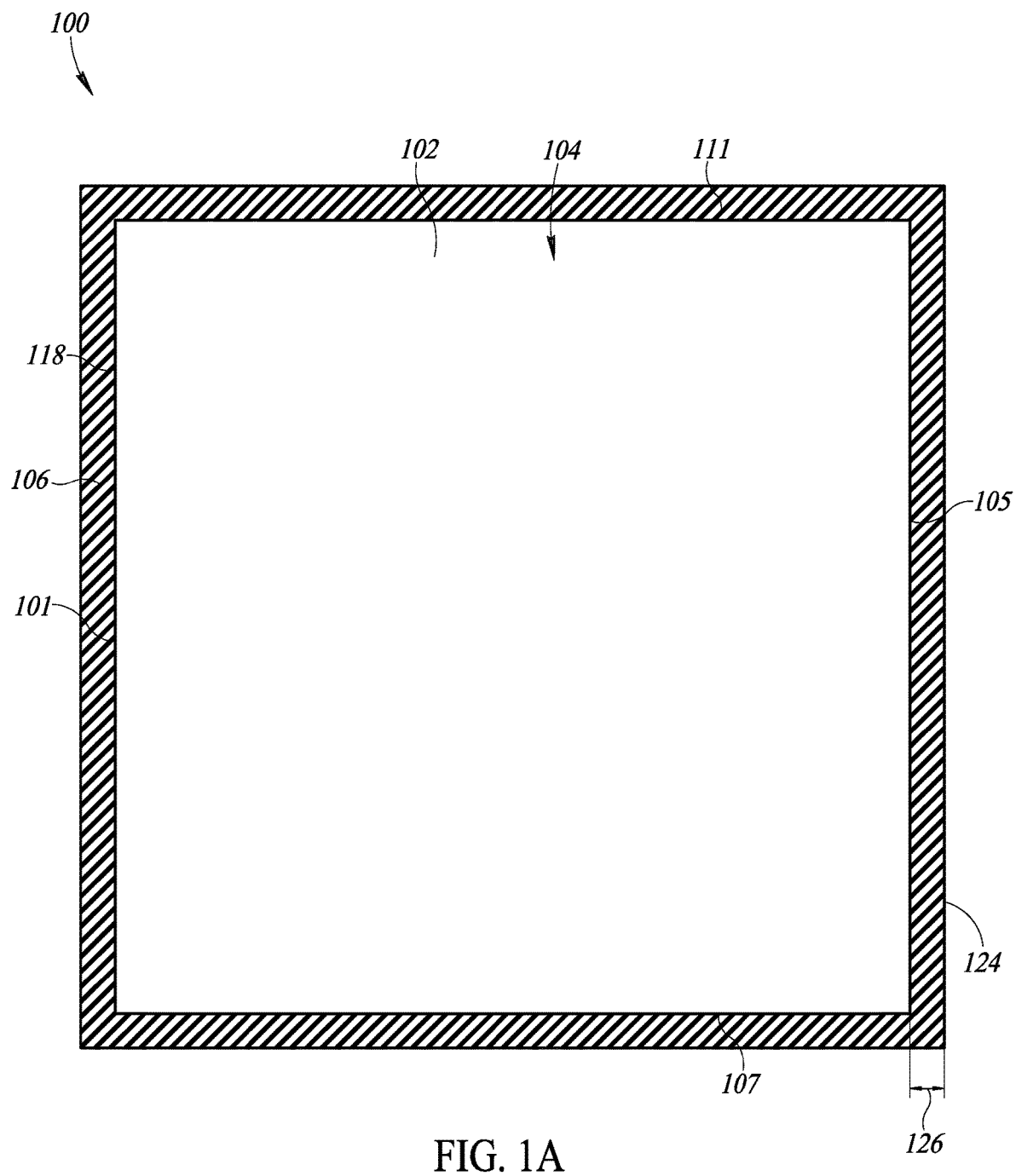
FIG. 1A is a plan view of one side of an exemplary embodiment of a semiconductor package according to the present disclosure having molding compound on sidewalls of a die with a surface of the die exposed.
Figure 1B:
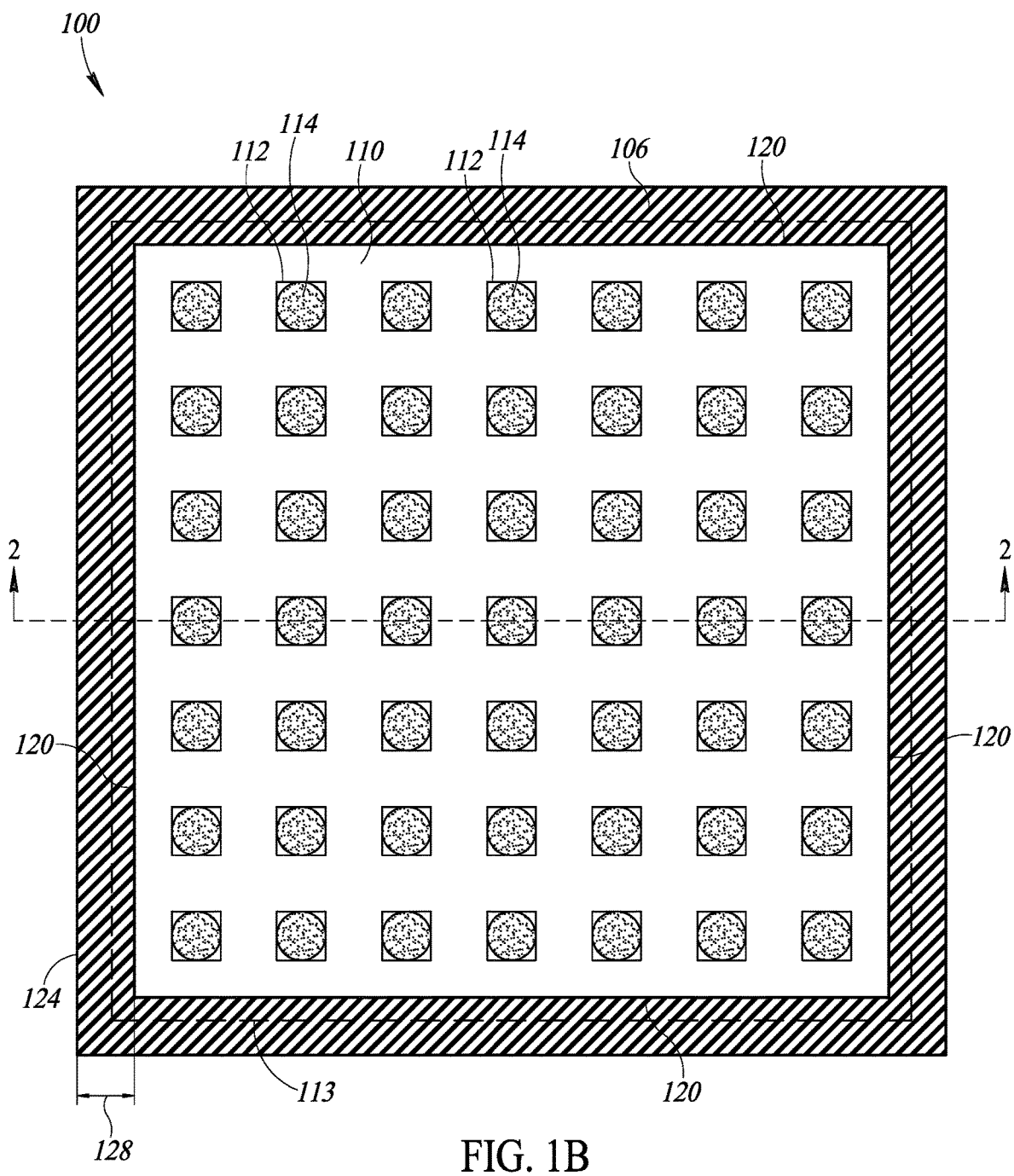
FIG. 1B is a plan view of another side of the semiconductor package of FIG. 1A illustrating a plurality of solder balls coupled to a plurality of under bump metallization layers on a redistribution layer.
Figure 2:
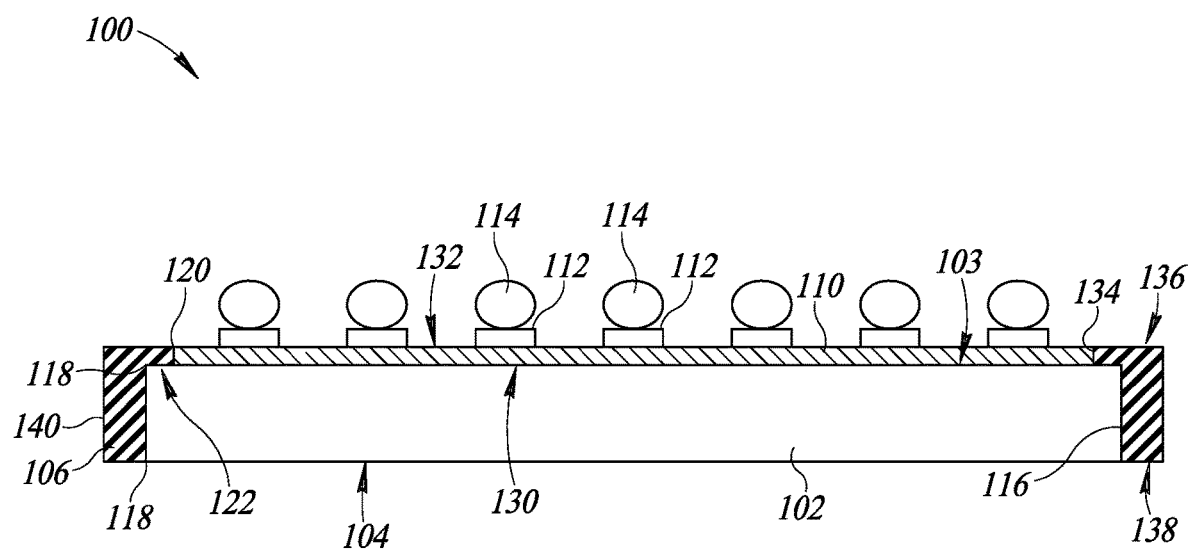
FIG. 2 is a cross-sectional view of the semiconductor package of FIGS. 1A and 1B, through the line 2-2 in FIG. 1B, having molding compound on the sidewalls and a surface of the die.

FIGS. 1A-B and 2 illustrate a semiconductor package 100 with a die 102 having a first surface 103 opposite a second surface 104. In an embodiment, the first surface 103 is an active surface of the die 102 and the second surface 104 is a non-active surface, or backside of the die 102.

As shown in FIG. 1A, the second surface 104 of the die 102 has an area bounded by a first outermost edge 118 extending around the second surface 104 of the die 102. The first outermost edge 118 of the second surface 104 of the die 102 includes first, second, third and fourth edges 101, 111 105, 107, respectively, of the die 102. One of skill in the art will appreciate that the first surface 103 can include identical features to the second surface 104, namely, an area bounded by the first outermost edge 118, wherein the first outermost edge 118 comprises four edges, i.e., forms sidewalls of the semiconductor die. Molding compound 106 surrounds the die 102 to protect the die 102, such as during transportation. As such, the molding compound is formed adjacent to, or in contact with, the outermost edge 118, which includes each of the first, second, third and fourth edges 101, 111, 105, 107.

In the illustrated embodiment, the second surface 104 of the die 102 is exposed, or is not covered by the molding compound 106. However, in other embodiments described below, the molding compound 106 is on the second surface 104 of the die 102. Further, in embodiments where the first and second surfaces 103, 104 are identical, or are substantially equivalent, the first surface 103 has an equivalent, or substantially equivalent area to the second surface 104 that is bounded by the first outermost edge 118.

In certain other embodiments, the area of the first surface 103 is more or less than the area of the second surface 104 of the die 102. Further, although the die 102 is illustrated with a generally rectangular shape, one of skill in the art will appreciate that the die 102 can be formed to have a variety of different geometric shapes. In addition, the die 102 is preferably a semiconductor comprised of silicon, although other materials may be used for the die 102, for example, compound materials including any combination of silicon, germanium, tin, carbon, tellurium, boron, nitrogen, phosphate, arsenic, or other materials. Any number of materials may be used for the molding compound 106, such as a composite material consisting of epoxy resins, phenolic hardeners, silicas, catalysts, pigments, or mold release agents, among others.

FIG. 1B is a plan view of the semiconductor package 100 of FIG. 1A with a redistribution layer 110 having a plurality of under bump metallization layers 112 formed thereon. As described below with reference to FIG. 2, the redistribution layer 110 is formed on the first surface 103 of the die 102. The redistribution layer 110 and the plurality of under bump metallization layers 112 are preferably formed of copper, or a copper alloy, although other metals and their alloys may be used. The redistribution layer 110 couples contacts on the die (not shown) with the outside world, i.e., a plurality of solder balls 114 coupled to the plurality of under bump metallization layers 112. In other words, each of the plurality of solder balls 114 is coupled to a corresponding one of the under bump metallization layers 112 formed on, and in electrical communication with, the redistribution layer 110. FIG. 1B further illustrates a dashed line 113, which corresponds to the first outermost edge 118 (FIG. 1A) of the first surface 103 (FIG. 2) of the die 102 (FIG. 1A). As such, one of skill in the art will appreciate that although the first surface 103 is not shown in FIG. 1B because the molding compound 106 and the redistribution layer 110, an area of the first surface 103 is greater than an area of the redistribution layer 110.

The plurality of solder balls 114 are conductive and may be formed from any number of materials. In addition, although the solder balls 114 are illustrated with a generally circular shape for convenience, one of skill in the art will appreciate that the solder balls 114 may take the shape of an oval or a pillar, among other options. Similarly, the under bump metallization layers are illustrated as being generally square with a rectangular vertical cross-section, although one of skill in the art will appreciate that the under bump metallization layers 112 may include a cavity or depression for receiving each of the generally circular solder balls 114.

The semiconductor package 100 illustrated in FIG. 1B includes the plurality of solder balls 114 including 49 solder balls, each coupled to a respective under bump metallization layer 112, arranged equidistant apart from each other and also equidistant from a second outermost edge 120 of the redistribution layer 110. However, one of skill in the art will appreciate that the plurality of solder balls 114 and under bump metallization layers 112 may include more or less than the number illustrated, for example, embodiments of the present disclosure include the plurality of solder balls comprising any number of solder balls from 1 to 100, or more, solder balls. Similarly, it may be preferable, depending on the application for the package 100, for the spacing between each solder ball 114 and each under bump metallization layer 112 to be different from each other, as well as spaced a larger or smaller distance from the second outermost edge 120 than the distance shown in FIG. 1B. As such, the present disclosure is not limited by the number and arrangement of the plurality of solder balls 114 and under bump metallization layers 112.

The redistribution layer 110 has an area bounded by the second outermost edge 120 extending around the redistribution layer 110. In this embodiment, the area of the redistribution layer 110 is less than the area of the first and second surfaces 103, 104 of the die 102. As will be explained in more detail below, this difference in area exposes a portion of the first surface 103 of the die.

FIG. 2 is a cross-sectional view of the semiconductor package 100 of FIG. 1A along line 2-2 in FIG. 1B. The semiconductor package 100 includes the die 102 having the first surface 103 opposite the second surface 104. The die 102 further includes sidewalls 116 extending between the first and second surfaces 103, 104. In an embodiment, a height of the sidewalls is between 100 microns and 400 microns. In other embodiments, a height of the sidewalls is between 200 and 350 microns. The redistribution layer 110 is formed on the first surface 103 of the die 102, and the plurality of under bump metallization layers 112 are on the redistribution layer 110. Each of the plurality of solder balls 114 is coupled to a corresponding one of the plurality of under bump metallization layers 112 formed on the redistribution layer 110, as described above.

Further, the die 102 includes the first surface 103 bounded by the first outermost edge 118. In other words, the area of the first surface 103 is bounded by the first outermost edge 118 because the first outermost edge 118 extends around the first surface 103 of the die 102. The redistribution layer 110 is bounded by the second outermost edge 120 extending around the redistribution layer 110. As such, the area of the redistribution layer 110 is bounded by the second outermost edge 120.

As shown in FIGS. 1A-B and FIG. 2, the area of the redistribution layer 110 is less than the area of the first surface 103 of the die 102, such that a portion 122 of the first surface 103 of the die 102 is exposed, or not covered, by the redistribution layer 110. When the molding compound 106 is formed on the die 102 and the redistribution layer 110 to form the package 100, the molding compound 106 is on the sidewalls 116 of the die 102 and the exposed portion 122 of the first surface 103 of the die 102 between the first outermost edge 118 of the first surface 103 of the die 102 and the second outermost edge 120 of the redistribution layer.

In other embodiments, the molding compound 106 includes a third outermost edge 124 of a second sidewall 140 of the molding compound 106. A first distance 126 between the third outermost edge 124 of the molding compound 106 and the first outermost edge 118 of the first surface 103 of the die 102 is less than a second distance 128 between the third outermost edge 124 and the second outermost edge 120 of the redistribution layer 120. In other words, in the illustrated embodiment, the second distance 128 is greater than the first distance 126. Further, one skilled in the art will appreciate that in an embodiment, the first distance 126 corresponds to a first thickness of the molding compound 106 between the third outermost edge 124 and one of the sidewalls of the die 102. Similarly, the second distance 128 corresponds to a second thickness of the molding compound 106 between the third outermost edge 124 and the third sidewall 134 of the redistribution layer 110. In this embodiment, the first thickness is less than the second thickness.

Further, the redistribution layer 110 includes a third surface 130 adjacent the first surface 103 of the die and a fourth surface 132 opposite the third surface 130 as well as a third sidewall 134 extending between the third and fourth surfaces 130, 132. A plane of a fifth surface 136 of the molding compound 106 is substantially coplanar with a plane of the fourth surface 132 of the redistribution layer 110. In yet further embodiments, the molding compound 106 includes a sixth surface 138 wherein a plane of the sixth surface 138 is substantially coplanar with the second surface 104 of the die 102.

FIG. 2 further illustrates that a plane of at least one of the sidewalls 116 of the die 102 is spaced from a plane of the third sidewall 134 of the redistribution layer 110. In other words, the first outermost edge 118 of the first surface 103 of the die 102 is spaced from the second outermost edge 120 of the third and fourth surfaces 130, 132 of the redistribution layer 110 to expose the portion 122 of the first surface 103 of the die 102, such that when molding compound 106 is formed on the die 102 and the redistribution layer 110, the molding compound 106 is on the first surface 103 of the die 102 between the first and second outermost edges 118, 120.

Figure 3:
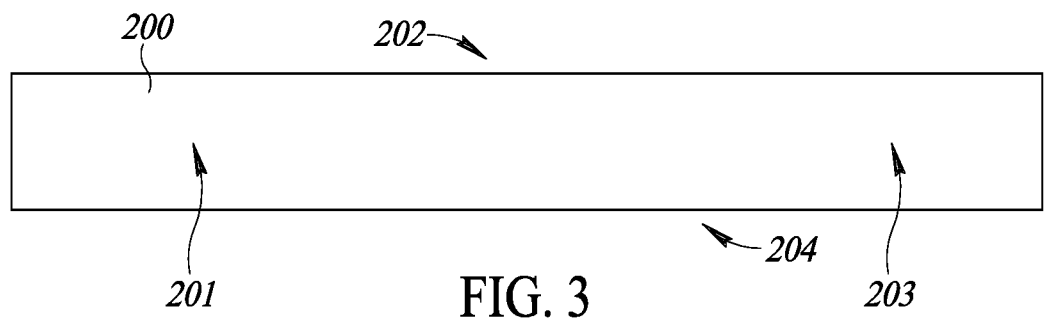
FIGS. 3-10 are cross-sectional views of an exemplary embodiment of a method for processing a plurality of semiconductor die according to the present disclosure illustrating the plurality of semiconductor die in various stages of manufacturing.

A method of forming a semiconductor package having the features described with reference to FIGS. 1A to 2 begins in FIG. 3. FIG. 3 is a cross-sectional view of a wafer 200, which may be silicon or other semiconductor material, having a first surface 202 opposite a second surface 204. The wafer includes a plurality of die that are formed simultaneously in and on the wafer. For example, a first die 201 is adjacent to a second die 203 in the wafer. Each die includes a plurality of active and passive circuit elements. Further, one of skill in the art will appreciate that because the wafer 200 includes the plurality of die, such as the first die 201 and the second die 203, each of the die 201, 203 include the first surface 202 opposite the second surface 204.

Figure 4:
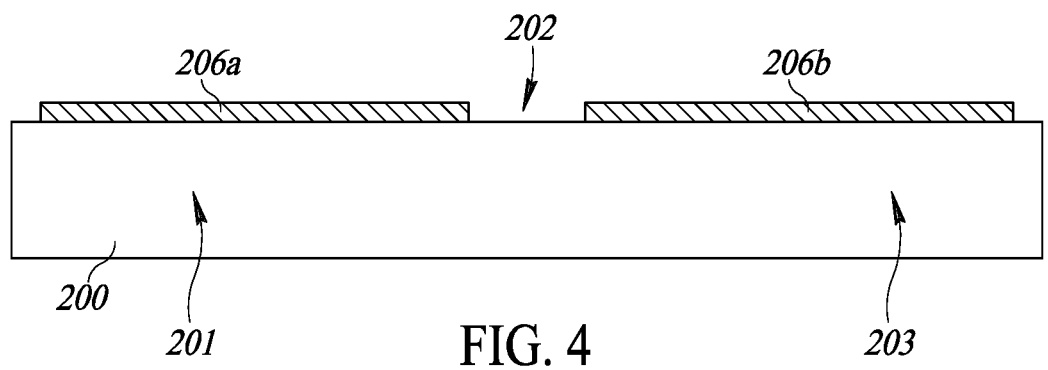

In FIG. 4, a redistribution layer 206a and 206b is formed on the first surface 202 of the wafer 200. This first surface 202 is an "active" surface of the wafer 200 or otherwise includes a plurality of contact pads (not shown) that are coupled to circuitry (not shown) formed within each die 201, 203. The redistribution layer 206a overlaps and is coupled to the first die 201 and the redistribution layer 206b overlaps and is coupled to the second die.

Figure 5:
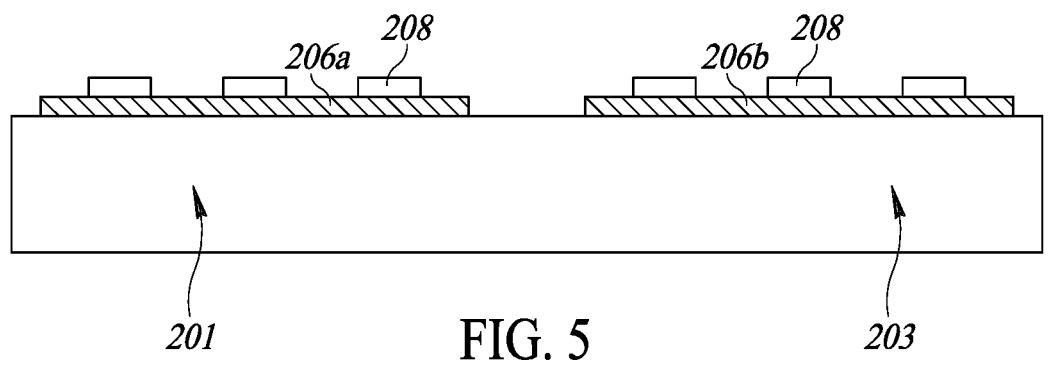

Then, in FIG. 5, a plurality of under bump metallization layers or ball supports 208 are formed on each redistribution layer 206a and 206b. Alternatively, the method can proceed from FIG. 4 without forming the under bump metallization layers 208. However, the remaining steps are provided using an exemplary embodiment that includes the plurality of under bump metallization layers 208. In addition, embodiments of the present disclosure include using only a single redistribution layer 206a and 206b, a single redistribution layer 206a and 206b in combination with one or more PI or PBO layers, as well as multiple redistribution layers and multiple redistribution layers in combination with one or more PI or PBO layers.

Figure 6:
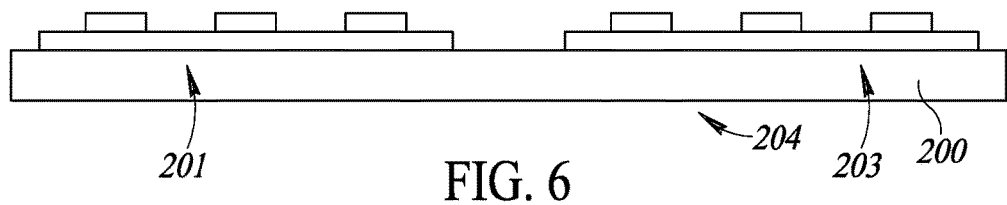
Figure 7:
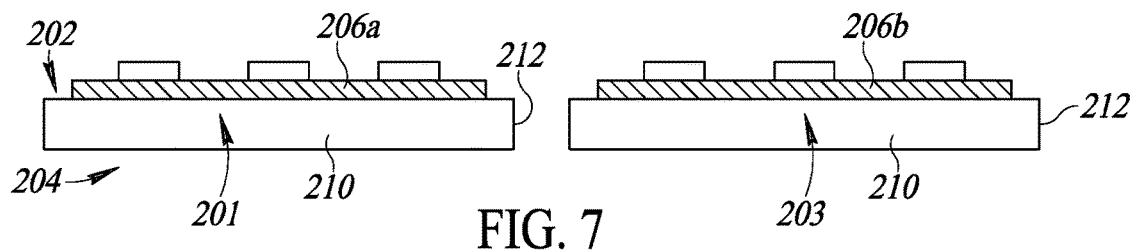

After the redistribution layer 206a and 206b is formed on the first surface 202 of the wafer 200 and the under bump metallization layers 208 are formed on the redistribution layer 206a and 206b, a backgrind process is performed on the second surface 204 of the wafer 200, as in FIG. 6. The backgrind may be performed by a mechanical grinding wheel or various types of etching, among other methods. The backgrind makes the wafer 200 thinner, removing excess silicon or other semiconductor material that does not house or contain the electronic circuitry. After the backgrind, the wafer 200 is singulated into a plurality of die 210, as in FIG. 7. Singulation may be performed by mechanical blade, laser processing, or various types of etching, among other methods. As noted above, the plurality of die 210 includes the first die 201 and the second die 203. However, one of skill in the art will also appreciate that the plurality of die can include any number of die from 2 to more than 1,000 die per wafer, depending on the size of the wafer 200, spacing of the die 201, 203 on the wafer 200, and saw street size when singulating the die, among other characteristics.

Each of the plurality of die 210 include sidewalls 212 extending between the first surface 202 and the second surface 204 of each die 210. Further, each of the die 210 includes a portion of the redistribution layer 206a and 206b on the first surface 202. As described herein, the redistribution layer 206a corresponds to the first die 201 of the plurality of die 210 and the redistribution layer 206b corresponds to the second die 203 of the plurality of die 210. Accordingly, each of the die 201, 203 of the plurality of die 210 include a respective portion 206a or 206b of the redistribution layer 206a and 206b.

Figure 8:
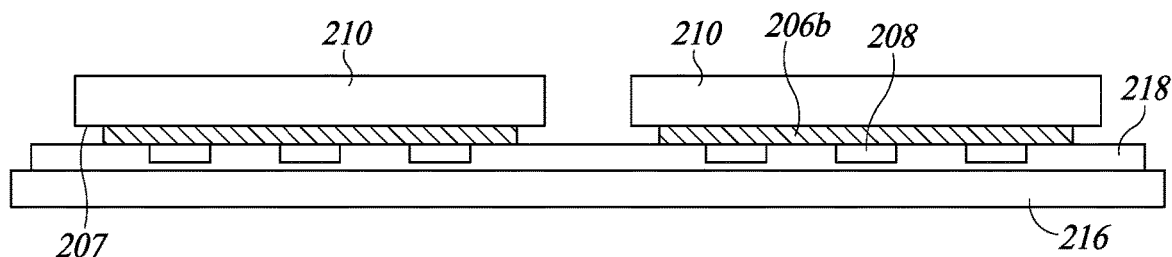
Figure 9:
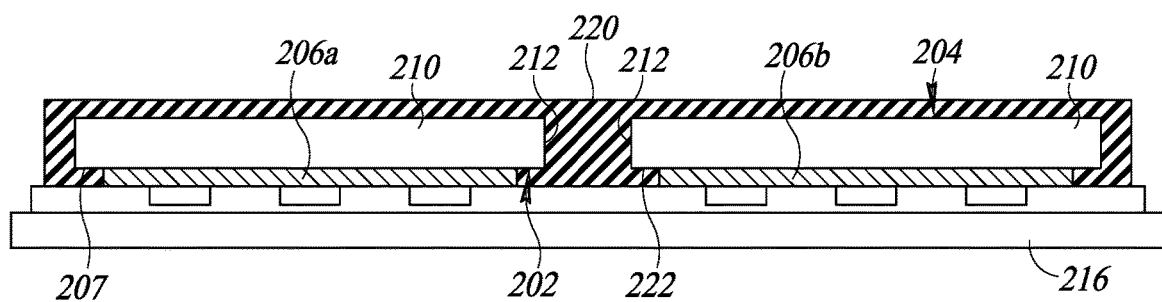

After the wafer 200 is singulated into the plurality of die 210, each of the die 210 are inverted and mounted onto a carrier 216, as in FIG. 8. The carrier includes a layer 218 for receiving the under bump metallization layers 208. In an embodiment, the layer 218 includes a tape. Alternatively, the layer 218 can receive the redistribution layer 206a and 206b if under bump metallization layers 208 are not used. A gap or space 207 between the uncovered portion of the first surface 202 of the die and the layer 218 remains.

After placing each of the die 210 on the carrier 216, molding compound 220 is formed on the second surface 204 of each die 210, surrounding each die 210, and in the gaps or spaces 207. As such, the molding compound 220 is on the sidewalls 212 of each die 210 and a portion 222 of the first surface 202 of each die 210 that is exposed by the redistribution layer 206a and 206b. In other words, because an area of the redistribution layer 206a and 206b is less than an area of the first surface 202 of each die 210, the space or gap 207 is formed between outer edges of the redistribution layer 206 and 206b and outer edges of the first surface 202 of each die 210, as explained above. When molding compound 220 is formed over each die 210, the molding compound will be on the first surface 202 in the space 207 between the outer edges of the redistribution layer 206a and 206b and the first surface 202, or a portion 222 of the first surface 202 adjacent to the redistribution layer 206a and 206b of each die 210.

Figure 10:
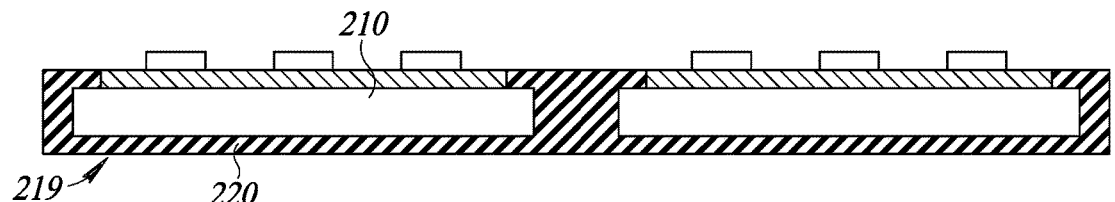

Once the molding compound 220 is in place, each of the die 210 are uncoupled from the carrier 216 and inverted for further processing, as in FIG. 10. FIG. 10 also illustrates that at this stage in the manufacturing process, the molding compound 220 couples each of the plurality of die 210 together to form a single, integral, unitary piece 219. As will be described below, this single, integral, unitary piece 219 is separated to form packages through additional processing variations, with each package containing at least one die 210.

Figure 11A:
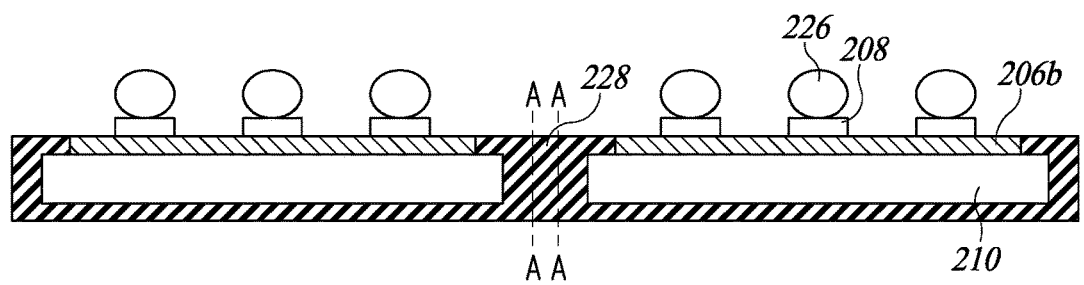
FIGS. 11A-B are cross-sectional views of an exemplary embodiment for forming a first plurality of semiconductor packages from the plurality of semiconductor die of FIGS. 3-10.
Figure 11B:
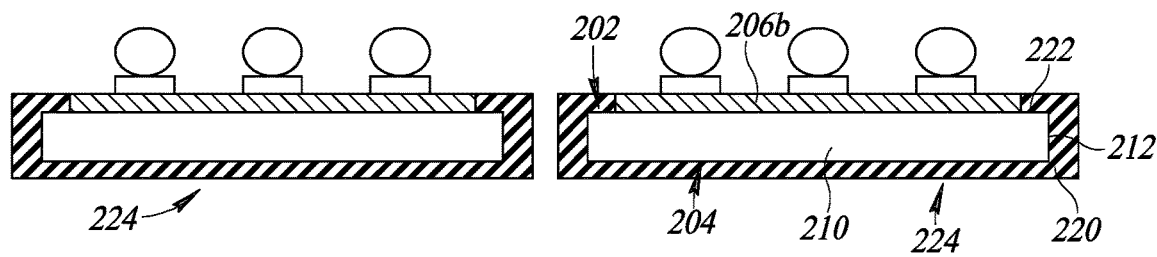

FIGS. 11A and 11B show one alternative embodiment of further method steps for forming a first plurality of semiconductor packages 224. In FIG. 11A, a first plurality of solder balls 226 are coupled to each of the under bump metallization layers 208 on the redistribution layer 206a and 206b on each die 210. Then, in FIG. 11B, each of the plurality of die 210 are separated from each other along lines A-A to form the first plurality of packages 224. The separating includes removing a portion 228 of the molding compound 220 between lines A-A in FIG. 11A by mechanical blade, laser processing, or etching, among other methods. Each package 224 then includes a die 210 with molding compound 220 on the second surface 204 of the die 210, as well as on the sidewalls 212 of each die 210, and the portion 222 of the first surface 202 between outer edges of the redistribution layer 206a and 206b and the first surface 202 of each die 210.

Figure 12A:
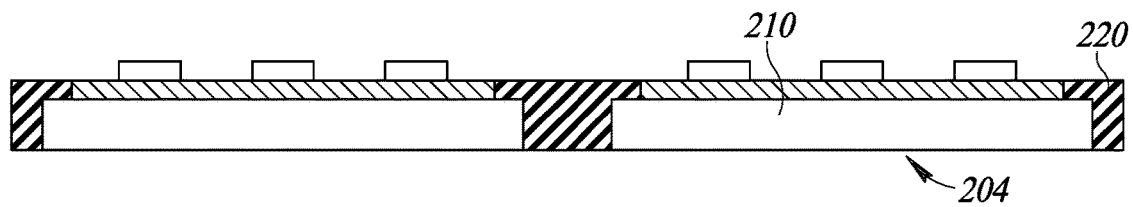
FIGS. 12A-C are cross-sectional views of an alternative exemplary embodiment for forming a second plurality of semiconductor packages from the plurality of semiconductor die of FIGS. 3-10.
Figure 12B:
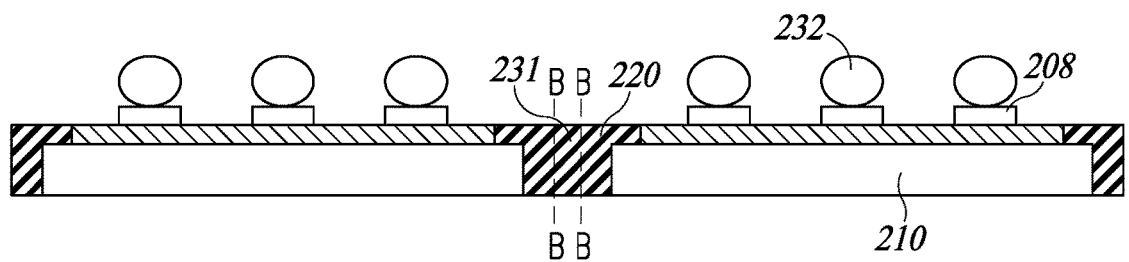
Figure 12C:
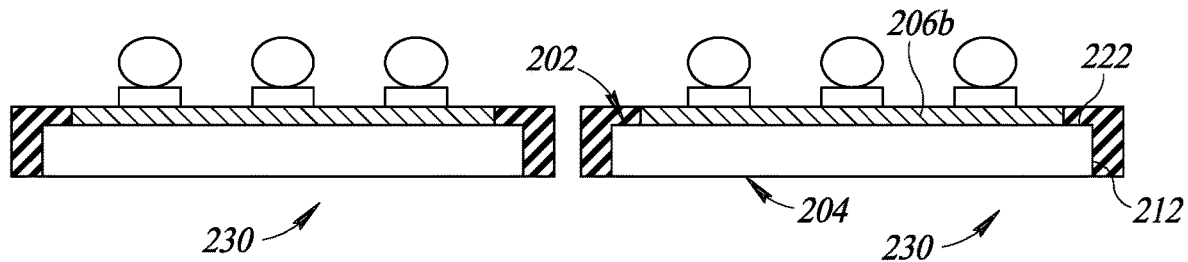

FIGS. 12A to 12C illustrate a further alternative embodiment of additional method steps for forming a second plurality of semiconductor packages 230. The additional processing begins with the unitary piece 219 of FIG. 10. Then, in FIG. 12A, a backgrind process is performed on the molding compound 220 to remove molding compound 220 adjacent the second surface 204 of each die 210. In some cases, the backgrinding includes exposing the second surface 204 of each die 210. Then, in FIG. 12B, a second plurality of solder balls 232 are coupled to each of the under bump metallization layers 208 after the backgrinding. Finally, in FIG. 12C, each of the plurality of die 210 are separated, as described above, into the second plurality of semiconductor packages 230. The plurality of die 210 are separated by removing a portion 231 of the molding compound 220 along the lines B-B in FIG. 12B. Each of the second plurality of semiconductor packages 230 illustrated in FIG. 12C includes an exposed second surface 204 of the die 210, and molding compound 220 on the sidewalls 212, as well on the portion 222 of the first surface 202 of each die 210 between the sidewall 212 of each die 210 and the redistribution layer 206a and 206b on the first surface 202 of each die.

Figure 13A:
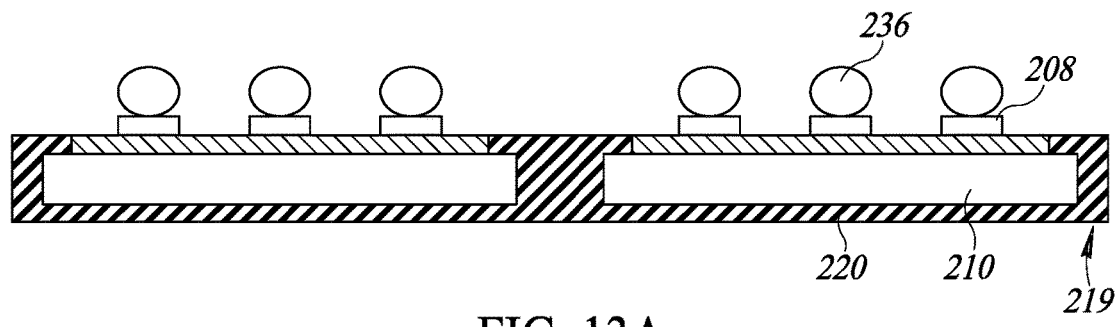
FIGS. 13A-C are cross-sectional views of an alternative exemplary embodiment for forming a third plurality of semiconductor packages from the plurality of semiconductor die of FIGS. 3-10.
Figure 13B:
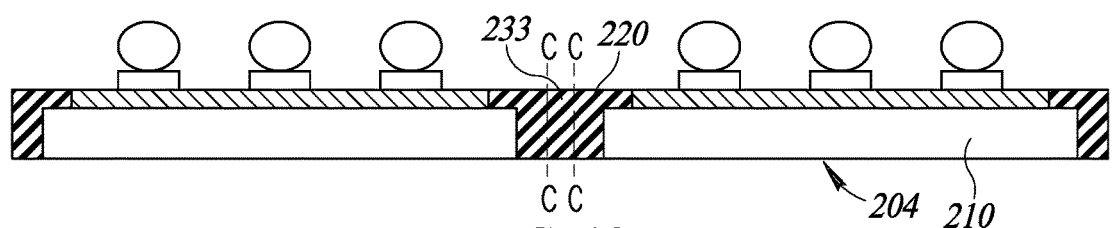
Figure 13C:
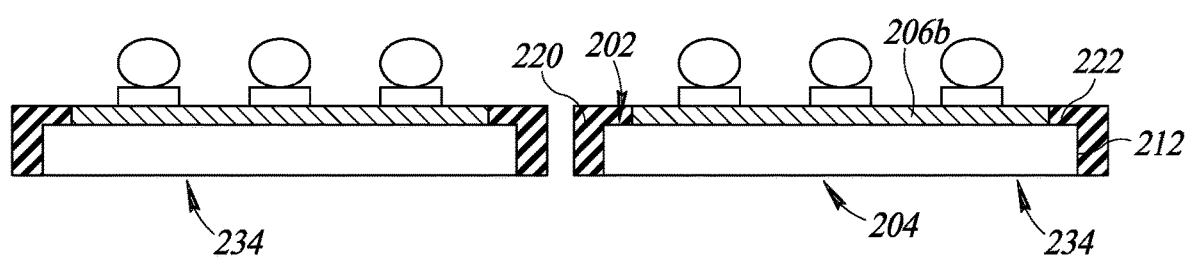

FIGS. 13A to 13C illustrate a further alternative embodiment of additional method steps for forming a third plurality of semiconductor packages 234. The additional processing begins with the unitary piece 219 from FIG. 10. Then, in FIG. 13A, a second plurality of solder balls 236 are coupled to each of a corresponding one of the plurality of under bump metallization layers 208. Then, after the coupling, a backgrind process is performed on the molding compound 220 to remove molding compound 220 adjacent second surface 204 of each die 210. In some cases, the backgrinding includes exposing the second surface 204 of each die 210. Finally, in FIG. 13C, each of the plurality of die 210 are separated, as described above, into the third plurality of semiconductor packages 234. The plurality of die 210 are separated by removing a portion 233 of the molding compound 220 along the lines C-C in FIG. 13B. Each of the third plurality of semiconductor packages 234 includes an exposed second surface 204 of the die 210, and molding compound 220 on the sidewalls 212, as well on the portion 222 of the first surface 202 of each die 210 between the sidewall 212 of each die 210 and the redistribution layer 206a and 206b on the first surface 202 of each die.

Further, as described above, the method may proceed without forming the plurality of under bump metallization layers 208. In such a case, the processing continues without the under bump metallization layers and a fourth plurality of packages can be created by coupling a fourth plurality of solder balls to the redistribution layer and separating each of the plurality of die, as described above. In an embodiment, forming the fourth plurality of packages includes backgrinding the molding compound before coupling the fourth plurality of solder balls to the redistribution layer.

As can be appreciated from the foregoing description, embodiments of the present disclosure allow for formation of semiconductor packages with molding compound on the sidewalls of a die, wherein the thickness of the molding compound can be controlled during processing in order to protect the die during transport of the finished package. For example, existing approaches for forming a WLCSP, such as a front side mold approach or a fan out approach, include forming molding compound on the sidewalls, if at all, to a maximum thickness of between 5 to 20 microns. By varying the die to die spacing when mounting the die 210 on the carrier 216, as in FIG. 8, a thickness of the molding compound 220 adjacent each sidewall 212 of each die 210 can be controlled. In an embodiment, the thickness of the molding compound 220 between an outer edge of the molding compound 220 and the sidewall 212 of the die is approximately 40 to 70 microns. In other embodiments, the thickness is between 30 to 80 microns, and in yet further embodiments, the thickness is between 20 to 90 microns.

As such, the significantly thicker molding compound 220 present on the sidewalls 212 of each die 210 in the semiconductor packages described herein provide adequate protection against chipping or cracking of the die 210 during transport. In addition, because the thickness of the molding compound 220 can be controlled, embodiments of the present disclosure can be adapted to provide an adequate amount of protection for a number of different applications. The molding compound on the portion 222 of the first surface 202 of each die 210 provides similar protection to the die 210, thus preventing chipping at the corners of the die 210, or on the first surface 202 of the die 210 between an outer edge of the redistribution layer 206a and 206b and an outer edge of the first surface 202 of each die 210.

The processes for forming such a package described herein are also more efficient than previous processes because there is no potential for mold residue to be left on the plurality of solder balls, thus eliminating an additional step in the process of forming prior packages. Further, certain embodiments of the present disclosure include using only a singular redistribution layer between a surface of the die and the under bump metallization layers, or solder balls, and as such, embodiments of the present disclosure further eliminate additional processing steps of forming PI or PBO layers on the die, while also reducing the amount of material required to produce a package.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
forming a plurality of packages by:
    forming a redistribution layer including at least one insulating layer and at least one conductive layer on the at least one insulating layer, the redistribution layer being formed on a first surface of a wafer;
    backgrinding a second surface of the wafer opposite to the first surface of the wafer;
    separating a plurality of die each including sidewalls extending from the first surface to the second surface and each including a portion of the redistribution layer by singulating the wafer and the redistribution layer;
    coupling ones of the portions of the redistribution layers to a carrier by inserting the portions of the redistribution layers in an adhesive layer on the carrier, inserting the portions of the redistribution layers into the adhesive layer includes inserting sidewalls of the portions of the redistribution layers into the adhesive layer at least partially covering sidewalls of the portions of the redistribution layers;
    covering the sidewalls and the second surfaces of the plurality of die by forming a molding compound on the plurality of die and the carrier; and singulating the plurality of packages between ones of the plurality of die and through the molding compound.

2. The method of claim 1, wherein inserting the portions of the redistribution layers into the adhesive further includes entirely covering sidewalls of ones of the portions of the redistribution layer by fully inserting the sidewalls of the portions of the redistribution layer into the adhesive.

3. The method of claim 2, wherein forming the molding compound further includes forming a third surface of the molding compound substantially flush with ones of the first surfaces of the plurality of die.

4. The method of claim 3, wherein forming the molding compound further includes leaving peripheral portions of the first surfaces of ones of the plurality of die each around a corresponding one of the portions of the redistribution layers exposed from the molding compound.

5. The method of claim 1, wherein inserting the sidewalls of the portions of the redistribution layers into the adhesive layer further includes forming gaps between the first surfaces of ones of the plurality of die and the adhesive layer by partially inserting the sidewalls of the portions of the redistribution layers into the adhesive layer partially covering sidewalls of the portions of the redistribution layers and spacing apart the first surfaces of the plurality of die from the adhesive layer.

6. The method of claim 5, wherein forming the molding compound further comprising partially covering the sidewalls of the portions of the redistribution layers partially inserted into the adhesive layer.

7. The method of claim 6, wherein forming the molding compound further includes covering peripheral portions of the first surfaces of ones of the plurality of die around a corresponding ones of the redistribution layers.

8. A method, comprising:
inserting an under bump metallization layer extending from a redistribution layer on a first surface of a die into an adhesive layer on a carrier;
inserting portions of the redistribution layer into the adhesive layer forming gaps between the first surface of the die and the adhesive layer by partially inserting sidewalls of the redistribution layer extending from the first surface of the die into the adhesive layer;
covering a second surface of the die opposite to the first surface and sidewalls of the die with a molding compound; and
removing the die and the redistribution layer from the carrier by removing the redistribution layer from the adhesive layer.

9. The method of claim 8, further comprising exposing the second surface of the die by removing a portion of the molding compound covering the second surface.

10. The method of claim 9, wherein removing the portion of the molding compound further includes grinding the portion of the molding compound.

11. The method of claim 8, further comprising forming a plurality of solder balls on the redistribution layer.

12. The method of claim 8, wherein forming the molding compound further includes filling the gaps with the molding compound, covering the sidewalls of the redistribution layer protruding from the first surface of the die with the molding compound, and covering a peripheral portion of the first surface adjacent to the sidewalls of the redistribution layer with the molding compound.

13. The method of claim 8, wherein inserting the redistribution layer into the adhesive layer further includes fully inserting sidewalls of the redistribution layer extending from the first surface of the die.

14. A method, comprising:
forming a package by:
inserting an under bump metallization extending from a redistribution layer on a first surface of a die into an adhesive layer on a carrier, inserting the under bump metallization into the adhesive layer includes forming a gap between the first surface of the die and the adhesive layer and between the sidewalls of the die and sidewalls of the redistribution layer; and
after placing the under bump metallization into the adhesive layer, forming a molding compound on a second surface of the die opposite to the first surface, sidewalls of the die, and between the die and the adhesive layer.

15. The method of claim 14, further comprising coupling a second surface of the redistribution layer to the adhesive layer.

16. The method of claim 14, wherein forming the molding compound further includes filling the gap with the molding compound covering the sidewalls of the redistribution layer and covering a peripheral portion of the first surface of the die with the molding compound.

17. The method of claim 14, further comprising fully covering sidewalls of the redistribution layer with the adhesive layer on the carrier by placing the sidewalls of the redistribution layer into the adhesive layer.

18. The method of claim 17, wherein forming the molding compound further includes forming a third surface of the molding compound coplanar with the first surface of the die.

19. The method of claim 14, further comprising:
partially inserting sidewalls of the redistribution layer into the adhesive layer;
wherein forming the molding compound including filling the gap with the molding compound partially covering the sidewalls of the redistribution layer and covering a peripheral portion of the first surface adjacent to the sidewalls of the redistribution layer.

* * * * *